:::

United States Patent [19]

Chang et al.

[11] Patent Number: 5,747,852
[45] Date of Patent: May 5, 1998

[54] LDD MOS TRANSISTOR WITH IMPROVED UNIFORMITY AND CONTROLLABILITY OF ALIGNMENT

[75] Inventors: K. Y. Chang, Los Gatos, Calif.; Mark I. Gardner, Cedar Creek; Fred Hause, Austin, both of Tex.

[73] Assignee: Advanced Micro Devices, Inc., Sunnyvale, Calif.

[21] Appl. No.: 861,190

[22] Filed: May 21, 1997

Related U.S. Application Data

[63] Continuation of Ser. No. 451,784, May 26, 1995, abandoned.

[51] Int. Cl.$^6$ .................................................. H01L 27/088
[52] U.S. Cl. ...................... 257/336; 257/344; 257/374; 257/408; 257/900
[58] Field of Search .................... 257/900, 408, 257/371, 374, 377, 396, 395, 344, 336, 412, 413, 379

[56] References Cited

U.S. PATENT DOCUMENTS

| | | | |
|---|---|---|---|
| 5,132,758 | 7/1992 | Minami | 257/900 X |
| 5,134,085 | 7/1992 | Gilgen et al. | 437/52 |
| 5,166,096 | 11/1992 | Cote et al. | 257/900 X |
| 5,200,351 | 4/1993 | Hadjizadeh-Amini | 437/44 |
| 5,217,910 | 6/1993 | Shimizu et al. | 437/35 |
| 5,324,974 | 6/1994 | Liao | 257/344 |
| 5,426,315 | 6/1995 | Pfiester | 257/900 X |
| 5,472,895 | 12/1995 | Park | 437/44 |

FOREIGN PATENT DOCUMENTS

| | | | |
|---|---|---|---|
| 0495650 A2 | 7/1992 | European Pat. Off. | 79/784 |
| 4058537 | 2/1992 | Japan | 257/408 |
| 6037106 | 2/1994 | Japan . | |
| 6077474 | 3/1994 | Japan . | |

OTHER PUBLICATIONS

"Submicrometer Salicide CMOS Devices With Self-Aligned Shallow/Deep Junctions," IEEE Electron Devices Letters, vol. 10, No. 11, 1 Nov., 1989, pp. 487–489.

*Primary Examiner*—William Mintel
*Attorney, Agent, or Firm*—Skjerven, Morrill, MacPherson, Franklin & Friel LLP; Ken J. Koestner

[57] ABSTRACT

A MOS integrated circuit device fabricated utilizing high energy, high current implanting of ions through a layer of oxide to form heavily doped source and drain regions which are self-aligned with a polysilicon gate. A thick portion of the oxide layer adjacent to the polysilicon gate prevents heavy doping in the substrate next to the gate. The oxide layer is removed and a lightly doped drain (LDD) implant forms an LDD region which is self-aligned with the gate. Using this method the source/drain and LDD implants are performed using only a single mask and etch operation, rather than two mask and etch operations which are necessary using a conventional process.

14 Claims, 8 Drawing Sheets

LDD MOS TRANSISTOR WITH IMPROVED UNIFORMITY AND CONTROLLABILITY OF ALIGNMENT

This application is a continuation of application Ser. No. 08/451,784, filed May 26, 1995 now abandoned.

FIELD OF THE INVENTION

This invention relates to the field of MOS technology devices, particularly MOS technology devices which employ lightly doped drain (LDD) structures. More specifically, this invention describes a new method of forming LDD structures to create a unique transistor structure having improved transistor performance and reliability.

BACKGROUND OF THE INVENTION

Hot-carrier effects cause unacceptable performance degradation in MOS devices built with conventional drain structures when channel lengths are short. To remedy this problem, alternative drain structures such as lightly doped drain (LDD) structures have been developed.

FIGS. 1(a) through 1(k) illustrate a typical method for fabricating CMOS transistors employing LDD structures. In FIG. 1(a), a P-channel transistor 110 and an N-channel transistor 160 in a silicon wafer 100 are shown after formation of gate structures but prior to source, drain and LDD ion implantation. A polysilicon gate 112 of the P-channel transistor 110 is formed overlying a region of N-doped substrate 114. A polysilicon gate 162 of the N-channel transistor 160 is formed overlying a region of P-doped substrate 164. In a first masking step and a first ion implant step, shown in FIG. 1(b), an LDD mask is applied and N− ions are implanted to form N-channel transistor LDD regions 166 which are self-aligned with the polysilicon gate 162. Similarly in a second masking step and a second ion implant step, shown in FIG. 1(c), an LDD mask is applied and P− ions are implanted to form P-channel transistor LDD regions 116 which are self-aligned with the polysilicon gate 112.

A layer of spacer oxide 102, shown in FIG. 1(d), is deposited overlying the silicon wafer 100 and the polysilicon gates 112 and 162. The spacer oxide layer 102 is etched in a first etching step to form spacers 118 on the sides of polysilicon gate 112 and spacers 168 on the sides of silicon gate 162, shown in FIG. 1(e). An anisotropic dry etching process is typically used to form spacers since wet etching processes are usually isotropic and generally unable to construct spacers having a suitable form. To achieve good uniformity across a wafer, dry etching of spacers is performed using a single etch chamber. Compared with batch wet processing to form spacers, dry etching using the single etch chamber is time consuming and hence increases manufacturing costs.

The form of the LDD region, which determines the hot carrier performance of the device, is established by the spacer profile. The spacer profile varies as a function of the spacer oxide etch time and the spacer oxide thickness. A particular amount of over-etch is necessary to form the spacers. However, excessive over-etching reduces the width and height of the spacers and causes gouging into the silicon. Control of the over-etch process becomes more difficult as the deposited spacer oxide layer thickness increases.

In a third masking step and a third ion implant step, shown in FIG. 1(f), a source/drain mask is applied and N+ ions are implanted to form N-channel transistor source and drain regions 170 which are self-aligned with the polysilicon gate 162 and spacers 168.

The implant energy for implanting As+ ions typically ranges from 40 KeV to 80 KeV. In a corresponding fourth masking step and a fourth ion implant step, shown in FIG. 1(g), a source/drain mask is applied and P+ ions are implanted to form P-channel transistor source and drain regions 120 which are self-aligned with the polysilicon gate 112 and spacers 118. The implant energy for implanting $BF_2+$ ions typically ranges from 40 KeV to 80 KeV. Generally, a typical source/drain P+ ion implant process is a shallow implant and therefore utilizes an implantation of $BF_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. $BF_2$ ions are larger and heavier ions so that a higher energy implant achieves a shallow depth. Unfortunately, fluorine atoms of the $BF_2$ causes unwanted defects in the silicon when it is implanted.

Referring to FIG. 1(h), an additional layer of oxide 104 is deposited to form resistors in various selected locations on the surface of the silicon wafer 100. In a resistor masking step and a resistor etching step, shown in FIG. 1(i), oxide layers are etched to the surface of the silicon wafer 100. This silicon etch operation is the second of two silicon etching operations. Silicon etching gouges and damages the silicon surface, degrading performance of the device.

In some MOS processes, titanium silicide ($TiSi_2$) is formed on the polysilicon gate electrode and source and drain regions of a device which greatly reduces sheet resistance, thereby improving device performance.

Accordingly, a titanium layer 108, shown in FIG. 1(j), is deposited overlying the surface of the silicon wafer 100, the gates 112 and 162 and the resistor 106. The titanium layer 108 is reacted with silicon to form a titanium silicide layer 190. The titanium does not react with the oxide of resistor 106 shown in FIG. 1(k). The titanium also does not react with the oxide of spacers 118 and 168 so that $TiSi_2$ is not formed in the region of the oxide spacers. The sheet resistance in the area under which the $TiSi_2$ is not formed is typically in the range of 1500 ohms/$cm^2$ in comparison with a sheet resistance of about 5 ohms/$cm_2$ in the silicided areas. The high sheet resistance in areas without silicidation degrades transistor performance.

A typical CMOS LDD fabrication process utilizes four masking steps to form the source, drain and LDD regions. A typical MOS fabrication process which forms surface area resistors utilizes a resistor protect deposition operation and a resistor protect etch operation. These operations increase fabrication complexity. A fabrication process that reduces fabrication complexity and maintains or improves device performance is always sought to reduce fabrication costs.

A typical MOS LDD fabrication process requires precise control of spacer oxide etch time and the spacer oxide thickness to form an LDD structure which ensures adequate device hot carrier performance. A fabrication process which improves or simplifies control of LDD form and allows the usage of a reduced spacer oxide deposition thickness is beneficial for controlling etch profile.

In a typical MOS process, silicon gouging due to excessive oxide etch during etching of the spacer oxide layer and silicon loss in resistor etching damage the silicon wafer, thereby degrading device performance. It is advantageous for a fabrication process to avoid damage to the silicon surface.

In a typical MOS fabrication process, LDD structures disadvantageously are characterized by an increased parasitic resistance of the source and drain regions caused by the lightly doped regions. This increase in resistance causes transistors to have a lower saturation current. A fabrication process which reduces parasitic resistance through improved control of the LDD form and by silicidation of the silicon wafer surface to the edge of the gate improves MOS device performance.

SUMMARY OF THE INVENTION

In accordance with the present invention, the development of high energy, high current ion implant machines makes possible simplification of a MOS LDD fabrication process.

In accordance with a first embodiment of the invention, a MOS transistor includes a semiconductor substrate of a first conductivity type, a gate electrode overlying a selected area of the semiconductor substrate, a lightly doped source region and a lightly doped drain region of a second conductivity type, and a heavily doped source region and a heavily doped drain region of the second conductivity type. The gate electrode has substantially vertical lateral sides. The lightly doped source and drain regions are formed in a shallow region of the semiconductor substrate and are self-aligned with the gate electrode. The heavily doped source and drain regions are formed in the shallow region and a deeper region of the semiconductor substrate and are self-aligned a controlled distance lateral to the gate electrode. The MOS transistor further includes a thin nitride layer formed on the substantially vertical lateral sides of the gate electrode. Furthermore, the transistor includes a layer of titanium silicide formed on the semiconductor substrate in areas other polysilicon gate areas. In these areas, the layer of titanium silicide is formed on the gate electrode.

In accordance with a second embodiment of the present invention, multiple transistors having the structure of the first embodiment of the invention are included in an integrated circuit device. In addition to the multiple transistors the integrated circuit device has a resistor including a selected resistor protect area of the semiconductor substrate, an oxide insulating layer overlying the resistor protect area of the semiconductor substrate and a silicon nitride layer overlying the oxide insulating layer.

In accordance with a third embodiment of the present invention, a method of fabricating an integrated circuit device includes the steps of forming a polysilicon gate on a surface of a semiconductor substrate, forming a thin silicon nitride layer overlying the polysilicon gate and the surface of the semiconductor substrate, depositing a layer of spacer oxide on the polysilicon gate and the surface of the semiconductor substrate and applying a source/drain photoresist mask overlying the layer of spacer oxide. The method also includes the steps of implanting a heavily doped ion implant region in the semiconductor substrate using a high energy, high current implant machine to form transistor source and drain regions which are self-aligned with the polysilicon gate and with an increased thickness spacer oxide layer adjacent to the sides of the polysilicon gate. The spacer oxide layer is removed in areas which are not protected by the source/drain photoresist mask and a lightly doped ion implant region is implanted in the semiconductor substrate to form transistor LDD regions which are self-aligned with the polysilicon gate.

The fabrication process as described above has several advantages. One advantage is that the number of masking steps to form the source, drain and LDD regions is reduced from four steps to two in a CMOS technology, thereby reducing the fabrication complexity of the devices. The number of masking steps to form the source, drain and LDD regions is reduced from two steps to one in NMOS and PMOS devices.

Another advantage is that a silicon nitride layer is utilized to protect the surface of the silicon wafer against damage arising from subsequent etching operations.

Additional advantages follow because spacers are not utilized to form implanted LDD regions. Rather than having spacers on the sides of the polysilicon gates, in the present invention a silicon nitride layer forms a straight vertical profile on a gate. This straight vertical profile has substantial thickness uniformity and controllability, thereby facilitating control of subsequent LDD doping procedures.

In a conventional process which employs spacers, the spacers are formed using time-consuming and costly anisotropic dry etch processes. In the present invention, the straight vertical profile of the gate sides fabricated using the improved process of the present invention employ much cheaper and faster wet etch processes.

A further advantage of the fabrication process of the present invention is that the high energy implant through a spacer oxide layer for source/drain implanting of P-channel transistors enables implanting of boron ions rather than the $BF_2$ ions utilized in a conventional process.

DETAILED DESCRIPTION

Figure 1A:
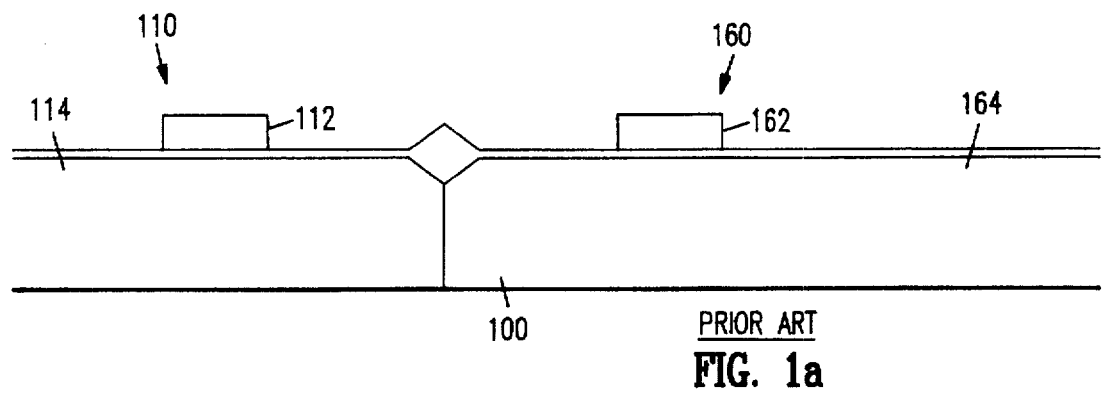
FIGS. 1(a) through 1(k) illustrate a conventional process flow for fabricating CMOS transistors in an integrated circuit device.
Figure 1B:
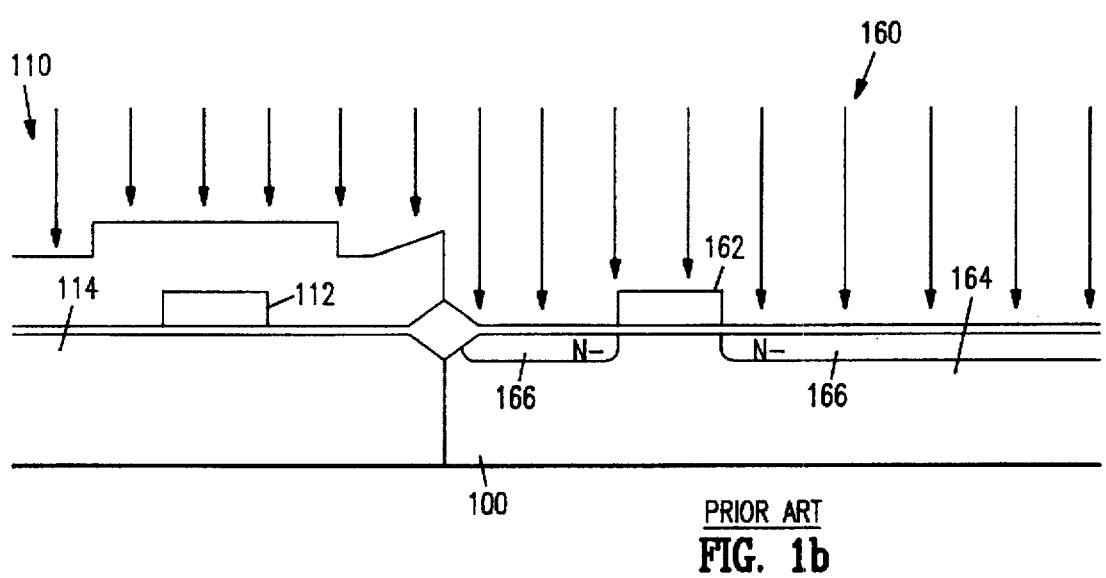
Figure 1C:
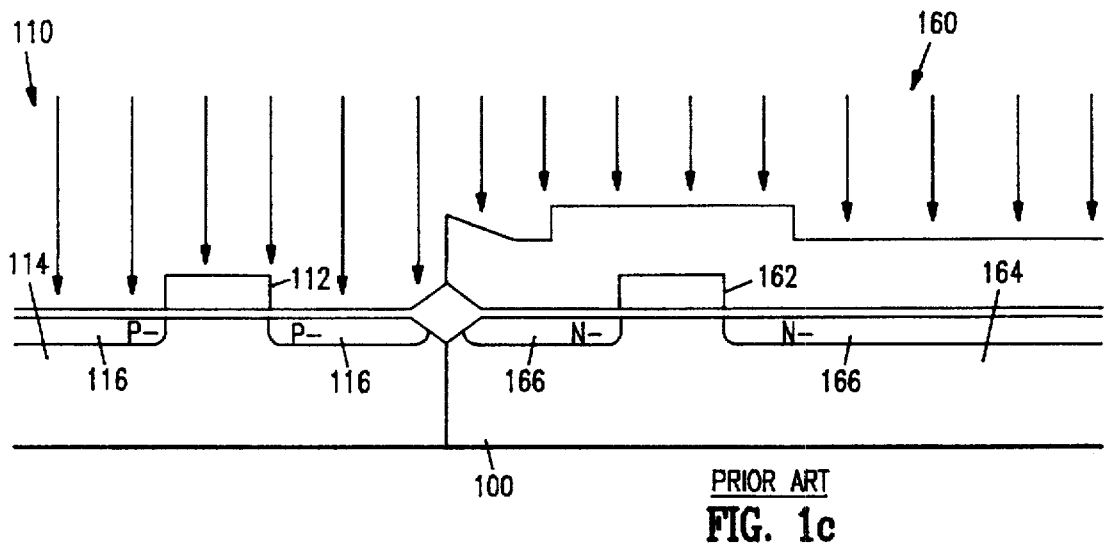
Figure 1D:
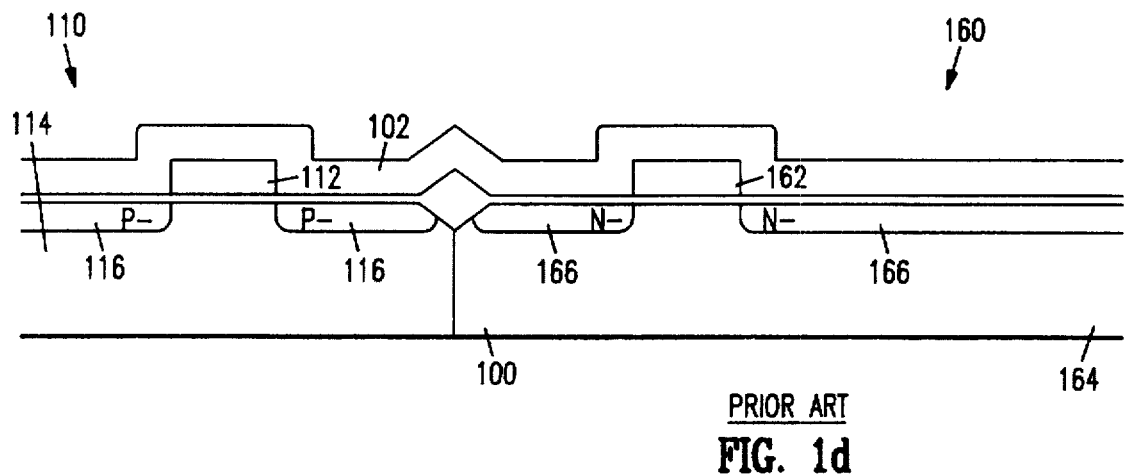
Figure 1E:
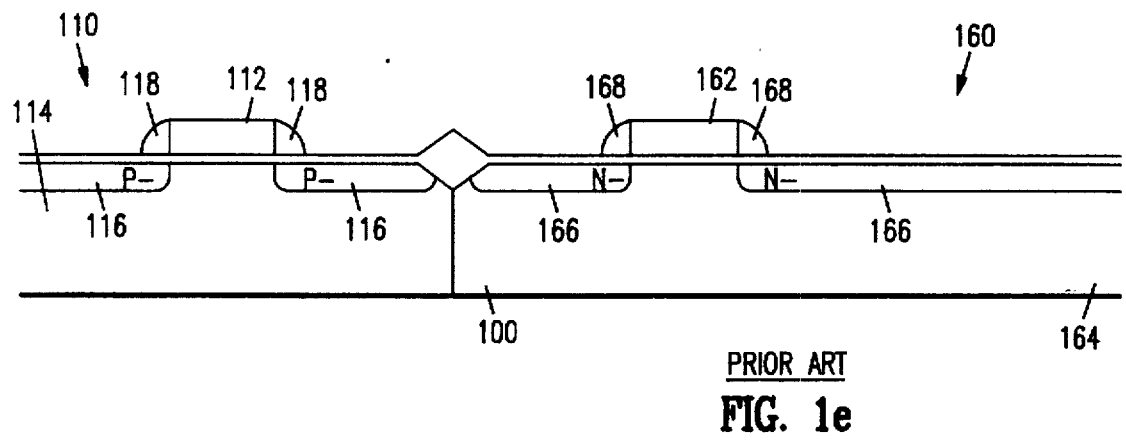
Figure 1F:
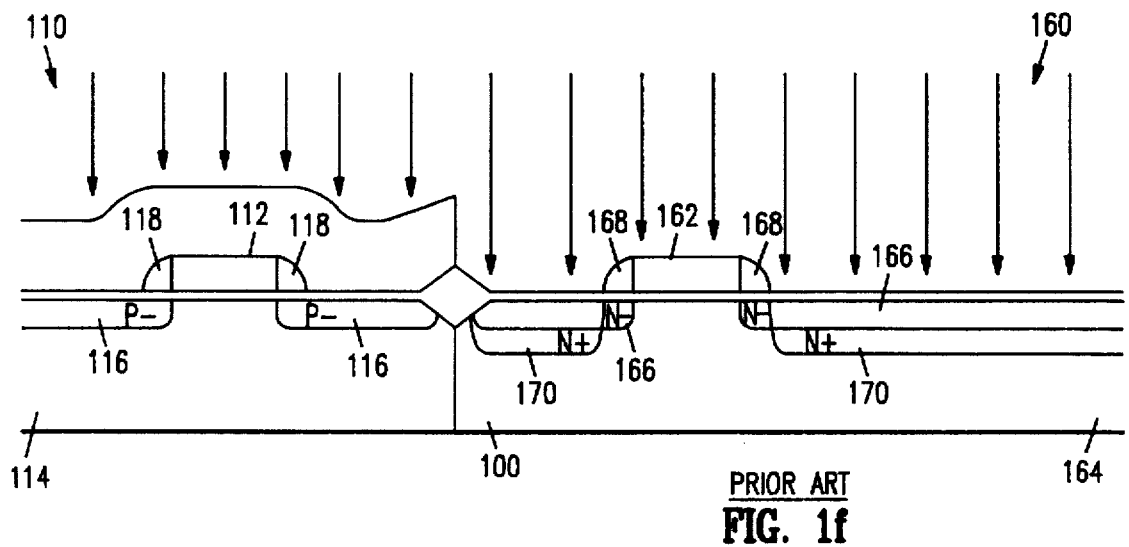
Figure 1G:
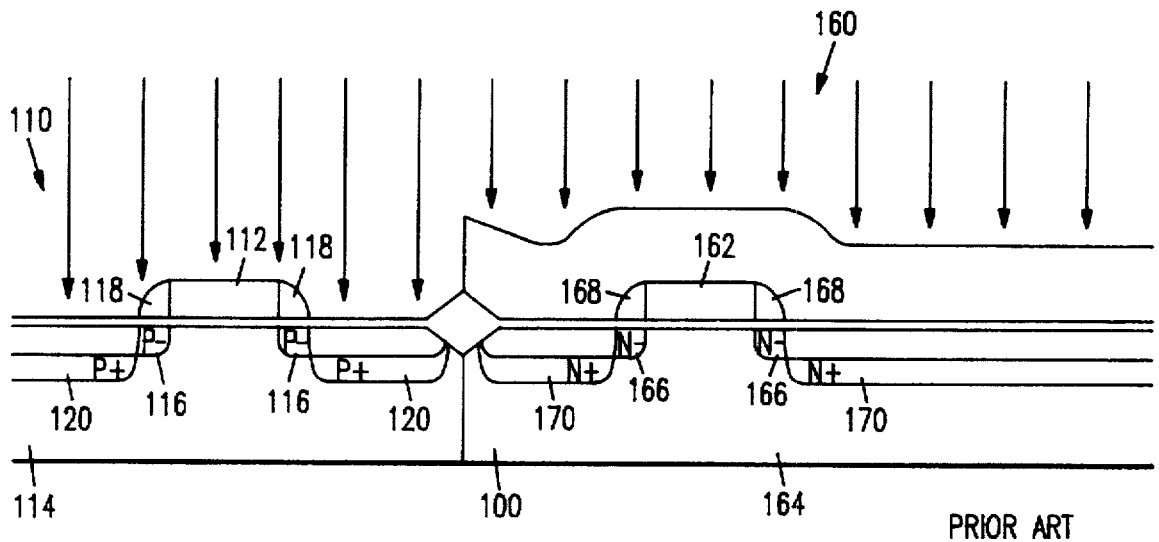
Figure 1H:
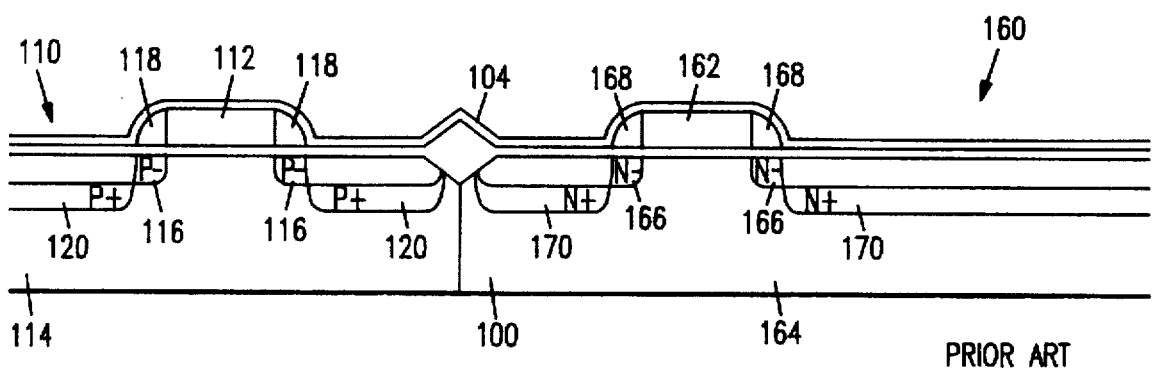
Figure 1I:
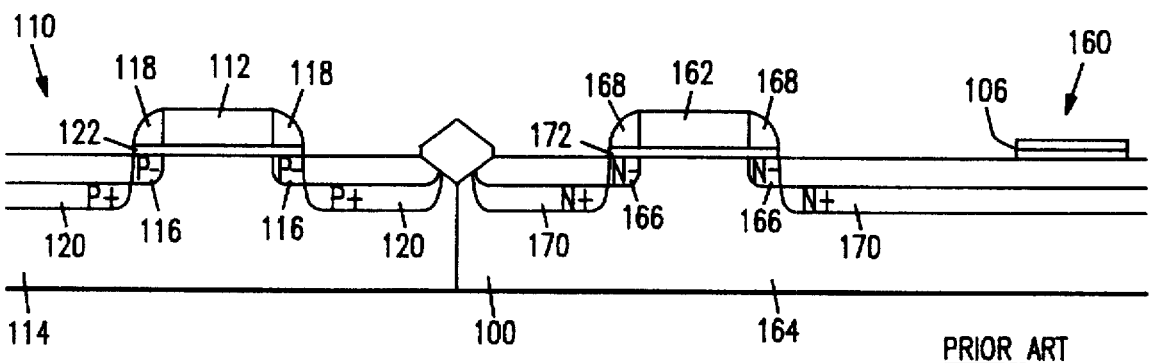
Figure 1J:
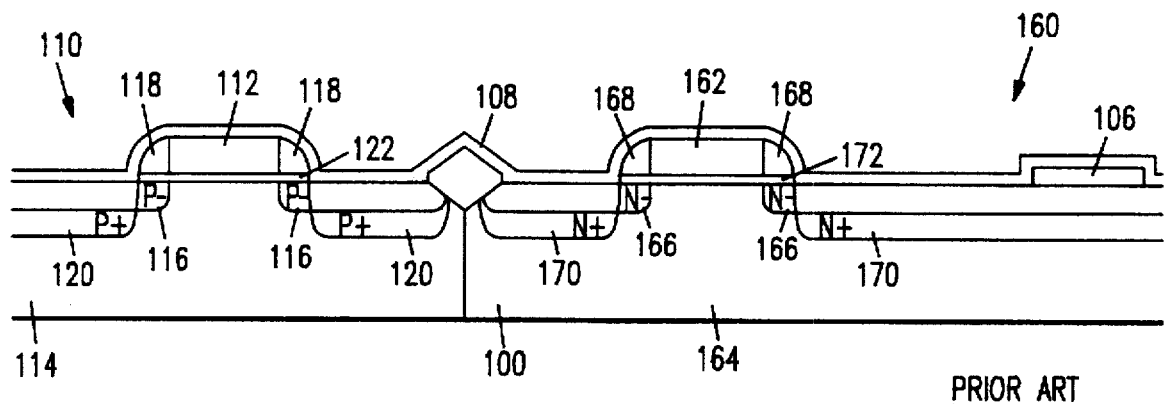
Figure 1K:
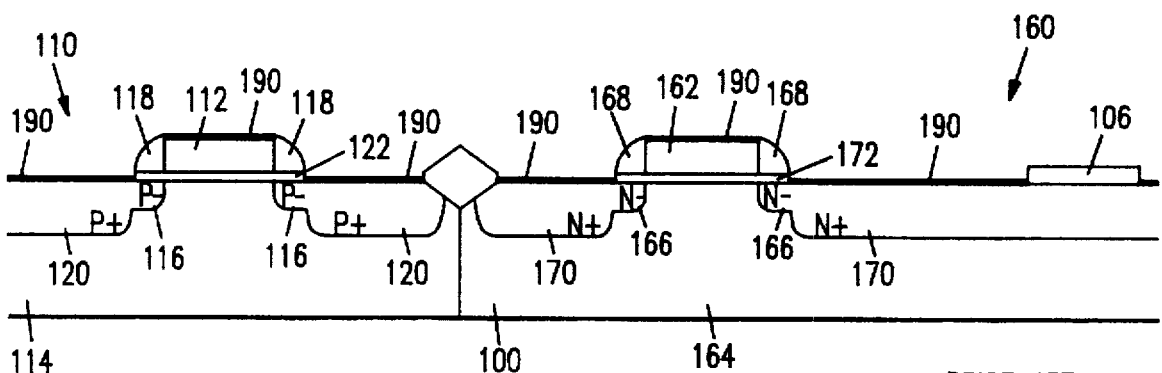
Figure 2A:
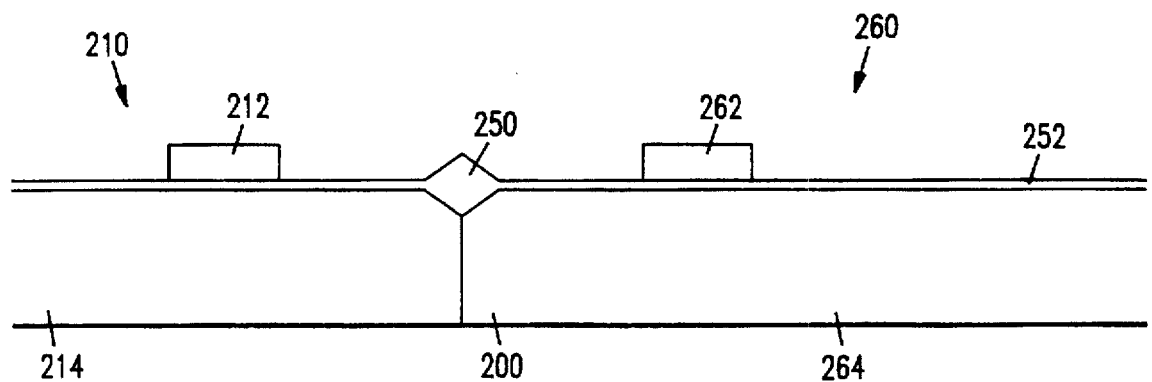
FIGS. 2(a) through 2(m) depict a process flow for fabricating CMOS transistors in an integrated circuit device in accordance with one embodiment of the present invention.

FIGS. 2(a) through 2(m) illustrate an embodiment of an improved method for fabricating CMOS transistors employing LDD structures. In FIG. 2(a), a P-channel transistor 210 and an N-channel transistor 260 in a silicon wafer 200 are implemented using a P-well, N-well or twin-tub technology. The starting material is a silicon wafer 200. Typically , the silicon wafer 200 is a lightly doped <100> wafer or a heavily doped <100> wafer with a lightly doped epitaxial layer at the surface. The P-channel transistor 210 is fabricated in an N-doped substrate 214 which is formed in a typical manner as either lightly doped N-substrate or a more heavily doped N-well structure. Similarly, the N-channel transistor 260 is fabricated in a P-doped substrate 264 which is formed in a typical manner as either lightly doped P-substrate or a more heavily doped P-well structure. Well structures are formed in a conventional manner by growing a thermal protection oxide layer, applying a mask which generally protects the silicon surface but exposes the well areas, and implanting ions into the well areas. Well ions are driven into the silicon by high temperature cycling while an oxide layer is grown in the well areas. A $V_T$ threshold-adjust implant is applied. The surface of the silicon wafer 200 is stripped of the oxide layer and a new pad-oxide/nitride layer for forming isolation structures is formed. A mask is applied to pattern the pad-oxide/nitride layer to define active device regions including the N-doped substrate region 214 and the P-doped substrate region 264 and to define field regions. Field oxide is then grown to form field oxide regions such as region 250 for isolating active device regions. The nitride/oxide layer is then removed from the active device regions. A gate oxide layer 252 is grown overlying the surface of the silicon wafer 200. A polysilicon gate layer is deposited by chemical vapor deposition (CVD) and a mask is applied to pattern the polysilicon into gate structures 212 and 262.

FIG. 2(a) shows the silicon wafer 200 after formation of gate structures but prior to source, drain and LDD ion implantation. A polysilicon gate 212 of the P-channel transistor 210 is formed overlying a region of N-doped substrate 214. A polysilicon gate 262 of the N-channel transistor 260 is formed overlying a region of P-doped substrate 264. All of the steps of the CMOS fabrication process up to and including the step of forming the gate structures are typical CMOS fabrication steps.

Figure 2B:
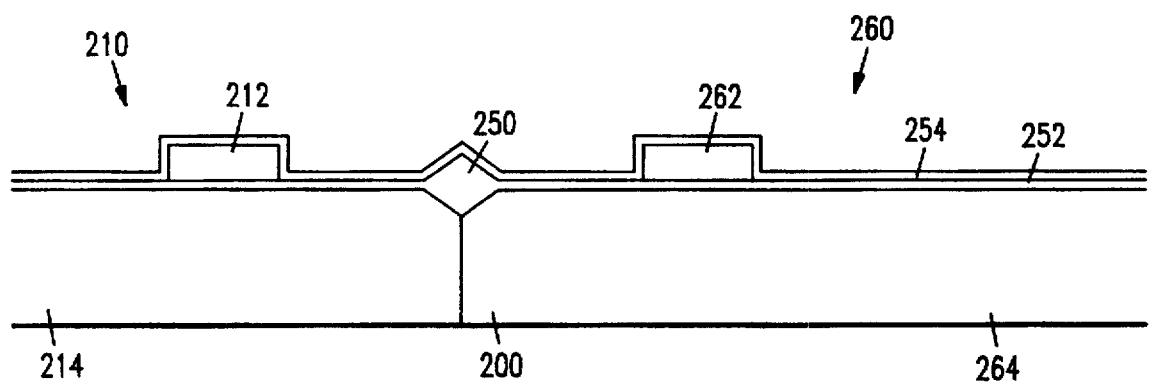

In a first step which differs from the steps of a typical CMOS process, a silicon nitride layer 254 is deposited overlying the surface of the silicon wafer 200 and overlying the polysilicon gates 212 and 262. The silicon nitride layer 254 is depicted in FIG. 2(b). A suitable thickness of the nitride layer 254 ranges from 100 Å to 500 Å. A preferred thickness is 250 Å. The silicon nitride layer 254 is substantially impervious to oxide etchants so that the surface of the silicon wafer 200 is protected against damage from subsequent etching operations. In addition, the silicon nitride layer 254 has a thickness which is easily controlled and forms a straight vertical profile on the lateral sides of the polysilicon gates 212 and 262. Uniformity and controllability of the silicon nitride layer 254 thickness facilitates control of subsequent LDD doping procedures.

Figure 2C:
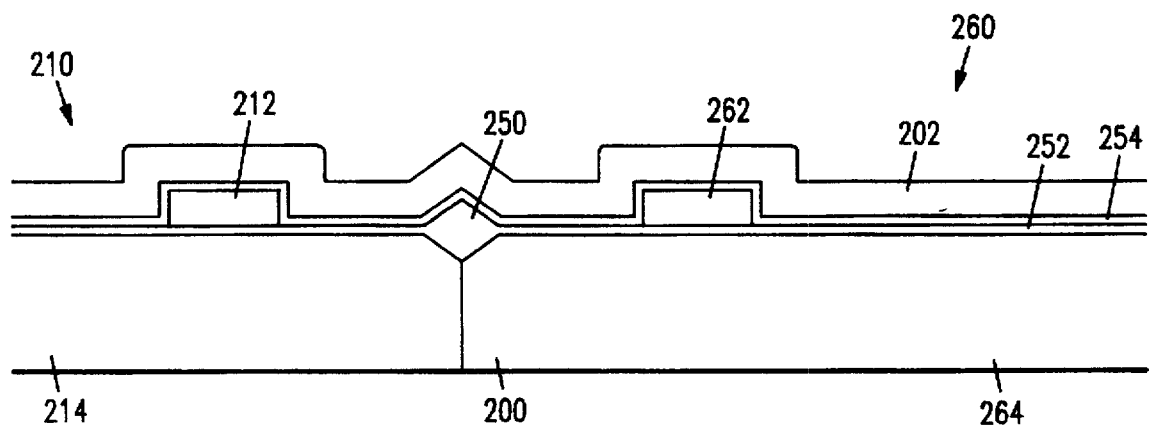
Figure 2D:
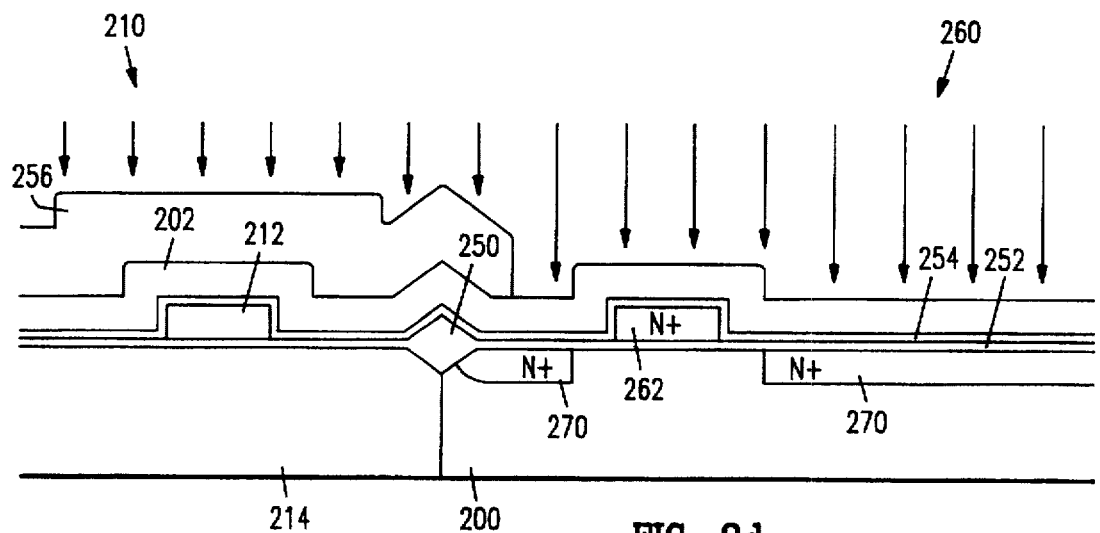

A layer of spacer oxide 202, shown in FIG. 2(c), is deposited overlying the silicon wafer 200, the polysilicon gates 212 and 262, and the nitride layer 254. A suitable thickness of the spacer oxide layer 202 ranges from 1000 Å to 2000 Å. A preferred thickness is 1500 Å. Adjacent to the lateral sides of the polysilicon gates 212 and 262, spacer oxide is deposited to an thickness which is increased by approximately the thickness of the gates 212 and 262. The thickness of the spacer oxide layer 202 in the improved CMOS process is generally smaller than the thickness of the spacer oxide layer 102 of the typical CMOS process because the typical process requires the spacer oxide thickness to be sufficient to avoid excessive etch loss. In the improved CMOS process, the spacer width is determined by the thickness of the deposited spacer oxide rather than by the size and form of the spacers as a result of etching. Thus a much more precise control of spacer size and form is achieved because variability inherent in the etching process, is eliminated. Furthermore, the deposited spacer has a well-defined rectangular profile rather than the tapered profile which results from the etching process. Precise control of the size and form of the spacers leads to a well-defined profile of the LDD implant.

Following deposition of the spacer oxide layer 202, N-channel transistors, including N-channel transistor 260 are fabricated. In the improved CMOS process a first masking step and a first ion implant step, shown in FIG. 2(d), an N+ source/drain photoresist mask 256 is applied and N+ ions are implanted using a high energy, high current implant machine (not shown) to form N-channel transistor source and drain regions 270 which are self-aligned with the polysilicon gate 262 and with the increased thickness of the spacer oxide layer 202 which is adjacent to the sides of the polysilicon gate 262. N+ ions are also implanted in the polysilicon gate 262. The N+ ion implant is a high energy implant which allows N+ ions to punch through the spacer oxide layer 202 in regions where the layer 202 is the deposited thickness but which substantially prevents the N+ ions from implanting in silicon beneath the thick regions of spacer oxide layer 202 adjacent to the sides of the polysilicon gate 262. In areas where the spacer oxide layer 202 overlies the polysilicon gate 262, the combined thickness of the gate 262 and oxide layer 202 essentially prevents N+ ion implanting. The implant energies for implanting N+ ions through various spacer oxide thicknesses are shown in Table 1.

TABLE 1

| Spacer oxide thickness | P+ | As+ |
| --- | --- | --- |
| 1000Å | 80 KeV | 200 KeV |
| 1500Å | 120 KeV | 300 KeV |
| 2000Å | 150 KeV | 400 KeV |

Figure 2E:
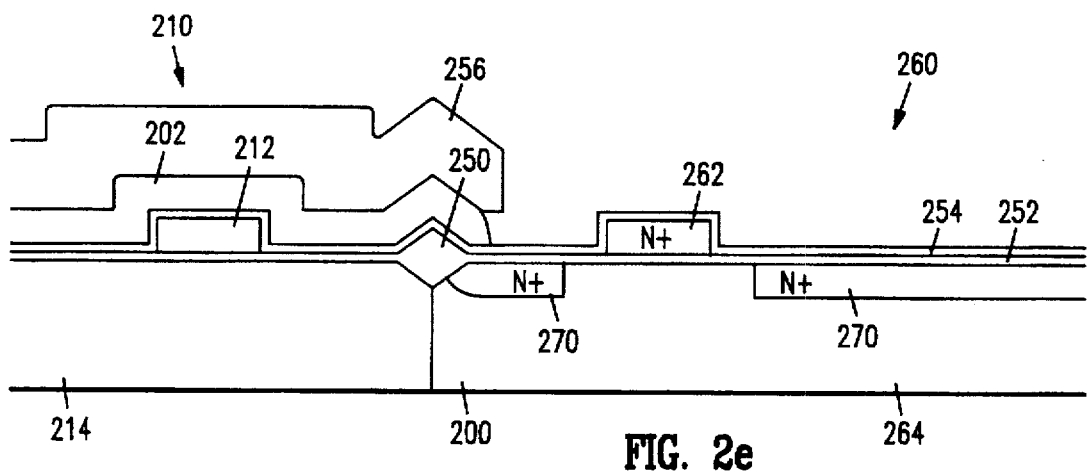

Following the high energy N+ source/drain implant step, the spacer oxide layer 202 is removed in the areas which are not protected by the source/drain photoresist mask 256, so that the N-channel transistor 260 takes the form shown in FIG. 2(e). The spacer oxide 202 is removed by performing a wet etching process such as a buffered oxide dip etch or alternatively by using a dry isotropic etch operation. An exemplary wet etch operation for removing silicon oxide is a 100:1 solution of hydrofluoric acid (HF), applied at room temperature and containing a buffering agent such as ammonium fluoride ($NH_4F$). Utilization of a wet etch process improves the etch time a hundredfold or more over the dry etch processes utilized to form spacers in typical CMOS LDD fabrication. An example of a dry isotropic etch procedure is etching of $SiO_2$ in a fluorocarbon plasma. These etching operations cleanly remove the spacer oxide layer 202 to the nitride layer 254. The silicon wafer 200 is protected because nitride is not soluble in the buffered hydrofluoric acid solution. No oxide spacers are left on the sides of the polysilicon gate 262 in contrast to the spacers 118 and 168 shown in FIGS. 1(e) through 1(k). The breadth of the spacers 118 and 168 depends on the spacer oxide thickness and etch time and is difficult to control. Because the spacer oxide layer 202 is cleanly removed in the improved CMOS LDD fabrication process, the form of the subsequently implanted LDD structures is tightly controlled and the alignment of the source/drain and LDD implants is enhanced.

Figure 2F:
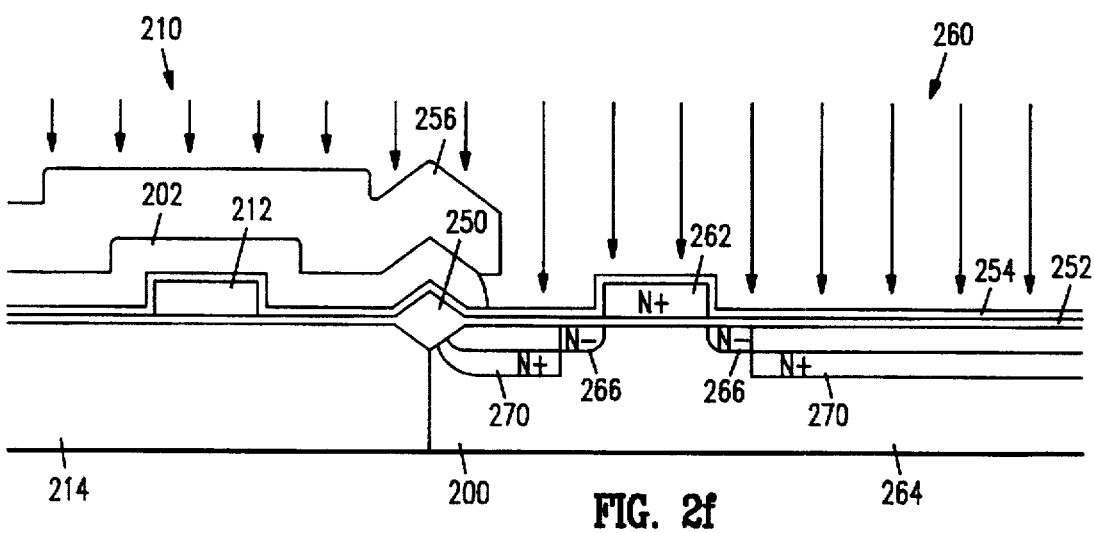
Figure 2G:
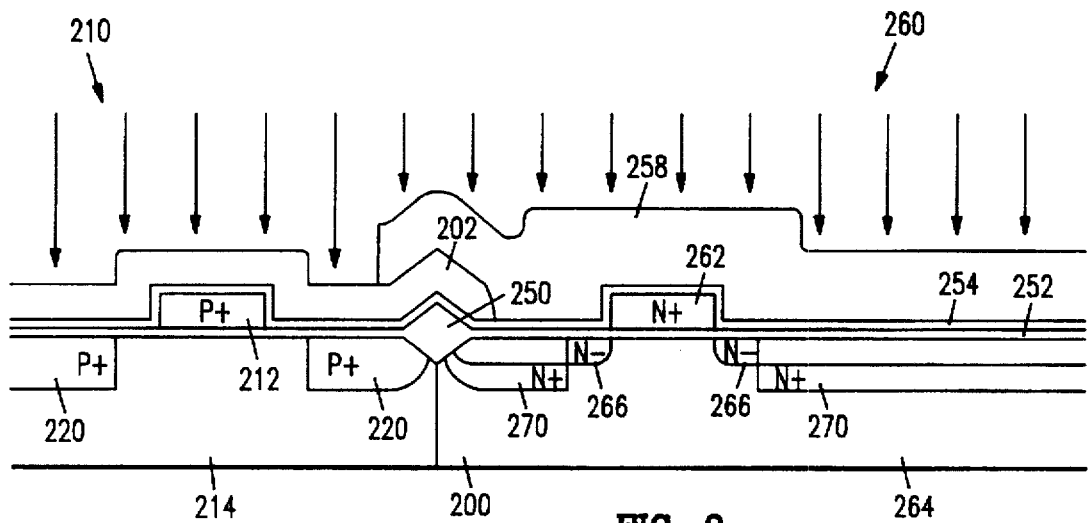

In the improved CMOS process a second ion implant step, an N- LDD implant step shown in FIG. 2(f), is applied without additional masking and etching to form N-channel transistor LDD regions 266 which are self-aligned with the polysilicon gate 262. Thus, the improved CMOS process eliminates an LDD masking and etching step, reducing fabrication complexity and reducing damage to the silicon surface. Phosphorus or arsenic N-type ions are implanted in the N- LDD implant step.

The photoresist layer 256 is then stripped and P-channel transistors, including P-channel transistor 210, are fabricated. In the improved CMOS process second masking step and a third ion implant step, shown in FIG. 2(g), a P+ source/drain photoresist mask 258 is applied and P+ ions are implanted using a high energy, high current implant machine to form P-channel transistor source and drain regions 220. P-channel source and drain regions 220 are self-aligned with the polysilicon gate 212 and with the thick portion of spacer oxide layer 202 adjacent to the polysilicon gate 212. P+ ions are also implanted in the polysilicon gate 212. The P+ ion implant is a high energy implant so that P+ ions generally punch through the spacer oxide layer 202 but P+ ions are blocked from implanting in silicon beneath thick regions of spacer oxide layer 202 adjacent to the polysilicon gate 212 and beneath the polysilicon gate 212. The implant energies for implanting P+ ions through various spacer oxide thicknesses are shown in Table 2.

TABLE 2

| Spacer oxide thickness | B+ | BF$_2$+ |
| --- | --- | --- |
| 1000Å | 30 KeV | 120 KeV |
| 1500Å | 50 KeV | 180 KeV |
| 2000Å | 60 KeV | 300 KeV |

Although BF$_2$ ions rather than boron ions are implanted in a typical CMOS LDD fabrication process because of lightness of the boron ions which prevents shallow implanting, the improved CMOS LDD fabrication process advantageously allows for boron ion implanting. High energy implanting through the spacer oxide layer 202 enables the usage of a boron ion implant because the spacer oxide layer 202 impedes the passage of boron ions, advantageously forcing the ions to implant in shallow regions of the silicon wafer 200.

Figure 2H:
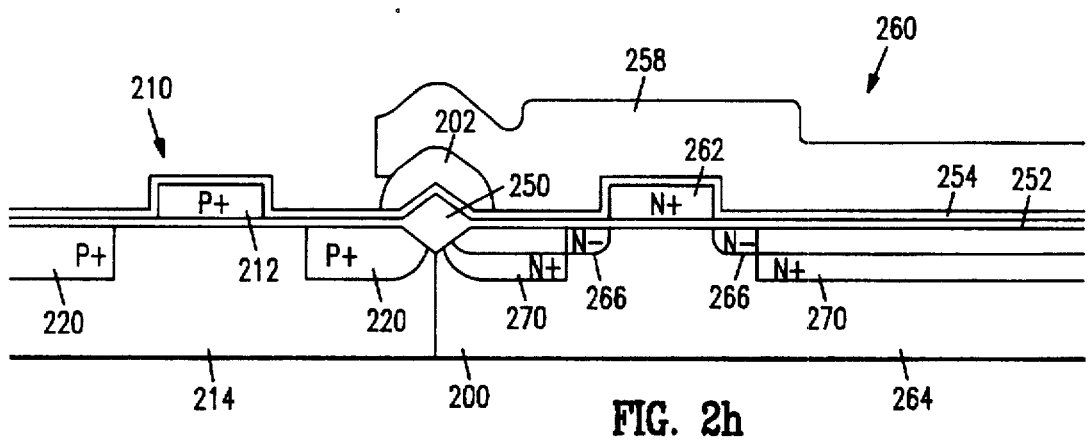

Following the high energy P+ source/drain implant step, spacer oxide layer 202 is removed in the areas not protected by the source/drain photoresist mask 258, so that the P-channel transistor 210 takes the form shown in FIG. 2(h). Spacer oxide 202 is removed as in removal of the spacer oxide layer 202 overlying N-channel transistor 260 using a wet etching process such as a buffered oxide dip etch or alternatively by a dry isotropic etch operation.

Figure 2I:
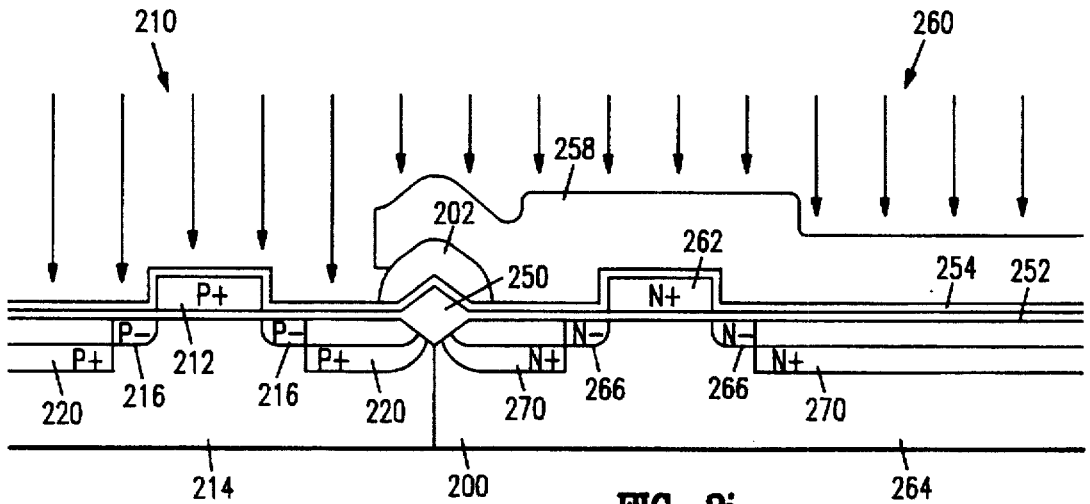

A fourth ion implant step, a P– LDD implant step shown in FIG. 2(i), is applied without additional masking and etching to form P-channel transistor LDD regions 216 which are self-aligned with the polysilicon gate 212. Thus, the improved CMOS process eliminates an LDD masking and etching step, reducing fabrication complexity and reducing damage to the silicon surface. Phosphorus or arsenic N-type ions are implanted in the N– LDD implant step.

Figure 2J:
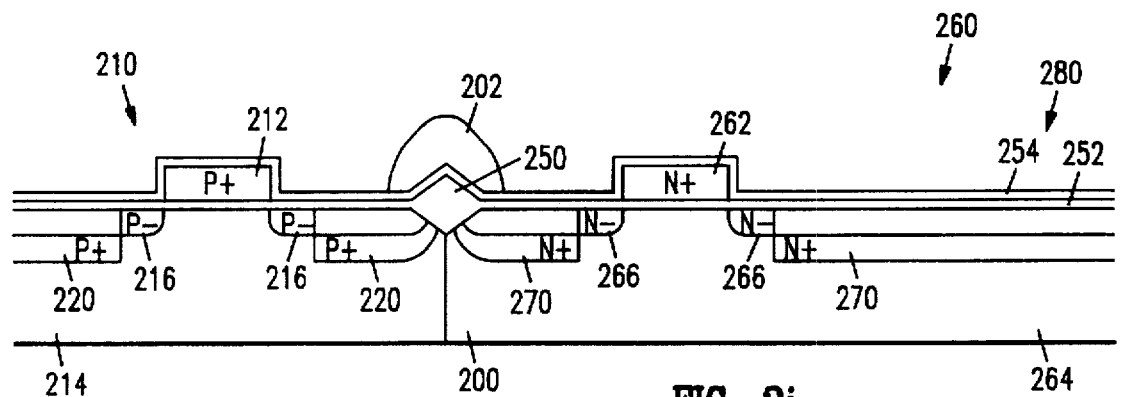

Referring to FIG. 2(j), the photoresist layer 258 is stripped leaving remnants of the spacer oxide layer 202 which can be removed easily by an additional quick wet dip etch. The implants are annealed using a rapid thermal annealing (RTA) process.

In some embodiments, resistor protect areas are provided to form resistors. A resistor protect area 280 is depicted in FIG. 2(j) with the spacer oxide layer in the area 280 removed.

Figure 2K:
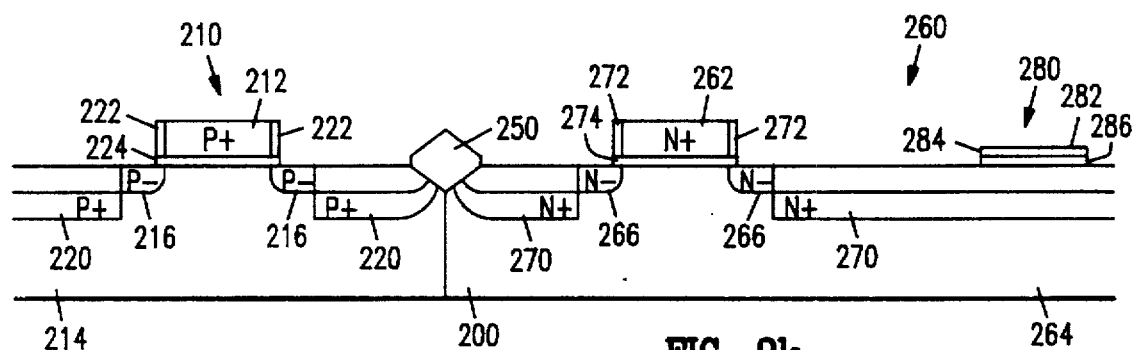

Referring to FIG. 2(k), a nitride spacer and resistor etch step is achieved by masking and etching to remove gate oxide layer 252 and silicon nitride layer 254 from the surface of the silicon wafer 200. Nitride spacers 222 and 272 on the sides of the transistor gates 212 and 262 are protected, as is a resistor 282. The resistor 282 includes a resistor nitride layer 284 and a resistor oxide layer 286 which are respectively patterned from the gate oxide layer 252 and the silicon nitride layer 254. The etching process of the nitride spacer and the oxide spacer is an anisotropic dry etch process. The anisotropic dry etch process is reasonably controllable and minimizes gouging into the silicon wafer 200 because typical dry etchants have a high selectivity to etch only nitride and oxide. Furthermore, the reduced thicknesses of the nitride and oxide films overlying the silicon in comparison with thicknesses typically employed to form spacers in a conventional process allow better control of etching, resulting in limited silicon gouging.

Figure 2L:
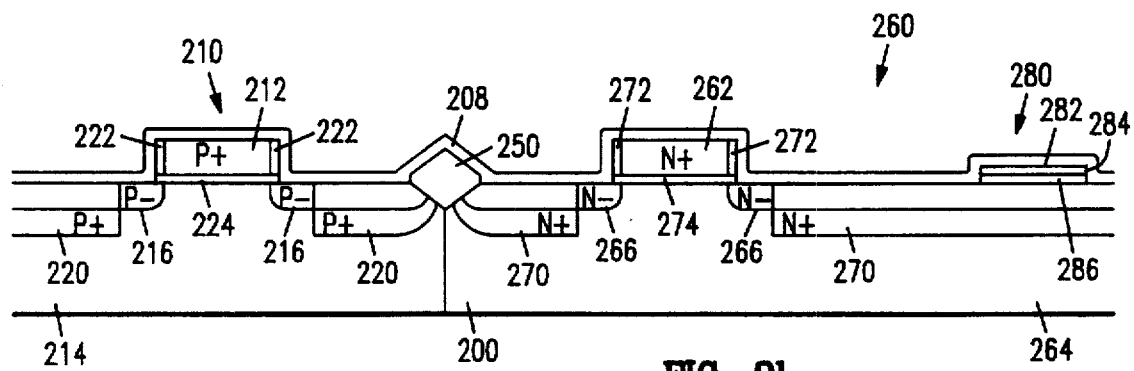

A titanium layer 208, shown in FIG. 2(l), is deposited overlying the surface of the silicon wafer 200, the gates 212 and 262 and the resistor 282 in preparation for forming titanium silicide (TiSi$_2$) on the polysilicon gate electrode and the source and drain regions to reduce sheet resistance. The titanium layer 208 is reacted with silicon to form a titanium silicide layers 290 and 292. Silicide (TiSi$_2$) is typically formed by furnace annealing in an inert gas atmosphere, for example argon gas for approximately 30 minutes. In another example, TiSi$_2$ is formed by rapid thermal annealing at 600°–800° C. in Ar. The titanium does not react with the nitride of spacers 222 and 272 and the resistor nitride layer 284 of resistor 282.

Figure 2M:
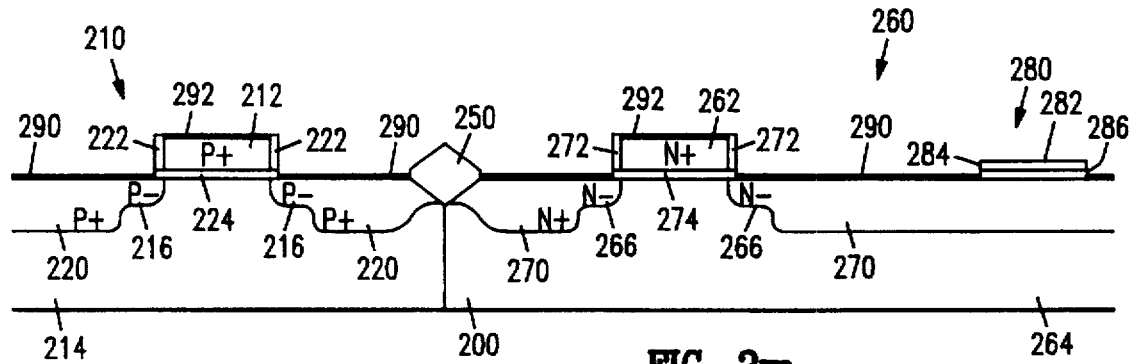

The structure resulting from reacting of the titanium to form titanium silicide is shown in FIG. 2(m). A titanium silicide layer 290 is formed on the surface of the silicon wafer 200 and a titanium silicide layer 292 is formed on the surface of the polysilicon gates 212 and 262. Because the silicon nitride spacers 222 and 272 and the nitride layer 284 of resistor 282 are constructed from a dielectric material which does not react with the titanium, titanium silicide is not formed on the nitride spacers 222 and 272 and the resistor 282. Thus the unfavorable aspect of the TiSi$_2$ process of the conventional process in which TiSi$_2$ is not formed in the region of the oxide spacers and sheet resistance in this area is greatly increased, is avoided. Instead, in the illustrative process, the titanium silicide layer 290 extends fully to the edge of the gates 212 and 262, improving the performance of transistors 210 and 260.

The description of certain embodiments of this invention is intended to be illustrative and not limiting. Numerous other embodiments will be apparent to those skilled in the art, all of which are included within the broad scope of this invention. The apparatus and method according to this invention are not confined to a CMOS technology but also apply to NMOS and PMOS technologies. In particular for MOS technologies, the method is applicable to P-well, N-well and twin-tub CMOS technologies.

We claim:

1. A MOS transistor comprising:

a semiconductor substrate of a first conductivity type having a substantially planar surface;

a gate insulating layer formed on the substantially planar surface of the semiconductor substrate;

a gate electrode formed on the gate insulating layer on the substantially planar surface of the semiconductor substrate, the gate electrode and the gate insulating layer having substantially straight vertical lateral sides;

a nitride layer having a substantially uniform thickness formed on the substantially straight vertical lateral sides of the gate electrode;

a lightly doped source region and a lightly doped drain region of a second conductivity type complementary to the first conductivity type formed in the semiconductor substrate, the lightly doped source region and lightly doped drain region being self-aligned to the gate electrode; and a heavily doped source region and a heavily doped drain region of the second conductivity type formed in the semiconductor substrate, the heavily-doped regions having a heavier doping dosage than the lightly doped regions, the heavily doped source region and heavily doped drain region being self-aligned a controlled distance lateral to the gate electrode and having a doping profile that is substantially straight and vertical.

2. A MOS transistor according to claim 1 wherein the heavily doped source region and the heavily doped drain region are self-aligned a controlled distance in a range from 1000 Å to 2000 Å lateral to the gate electrode.

3. A MOS transistor according to claim 1 wherein the heavily doped source region and the heavily doped drain region are self-aligned a controlled distance of approximately 1500 Å lateral to the gate electrode.

4. A MOS transistor according to claim 1 wherein the nitride layer is deposited on the substantially straight vertical lateral sides of the gate electrode a controlled thickness in a range from 100 Å to 200 Å.

5. A MOS transistor according to claim 1 wherein the nitride layer is deposited on the substantially straight vertical lateral sides of the gate electrode a controlled thickness of approximately 150 Å.

6. A MOS transistor according to claim 1 wherein the semiconductor substrate surface includes an area overlaid by the gate electrode and the nitride layer formed on the substantially straight vertical lateral sides of the gate electrode and an area adjacent to the gate electrode and nitride layer that is exposed, the MOS transistor further comprising:
   a layer of titanium silicide reacted onto the exposed area of the semiconductor substrate surface and reacted onto the gate electrode, the nitride layer being unreactive to titanium.

7. A MOS transistor according to claim 1 wherein the gate electrode is a polysilicon gate electrode that is heavily doped with ions of the second conductivity type complementary to the first conductivity type, the heavily doped polysilicon gate electrode having a heavier doping dosage than the lightly doped regions of the semiconductor substrate.

8. A MOS transistor comprising:
   a semiconductor substrate of a first conductivity type having a substantially planar surface;
   a gate insulating layer formed on the substantially planar surface of the semiconductor substrate;
   a gate electrode formed on the gate insulating layer on the substantially planar surface of the semiconductor substrate, the gate electrode and the gate insulating layer having substantially straight vertical lateral sides;
   a nitride layer having a substantially uniform thickness formed on the substantially straight vertical lateral sides of the gate electrode;
   a lightly doped source region and a lightly doped drain region of a second conductivity type complementary to the first conductivity type formed in the semiconductor substrate, the lightly doped source region and lightly doped drain region being self-aligned to the gate electrode; and
   a heavily doped source region and a heavily doped drain region of the second conductivity type formed in the semiconductor substrate, the heavily-doped regions having a heavier doping dosage than the lightly doped regions, the heavily doped source region and heavily doped drain region being doped by a high-energy, high-current implant and self-aligned a controlled distance lateral to the gate electrode so that a doping profile is formed that is substantially straight and vertical.

9. A MOS transistor according to claim 8 wherein the heavily doped source region and the heavily doped drain region are self-aligned a controlled distance in a range from 1000 Å to 2000 Å lateral to the gate electrode.

10. A MOS transistor according to claim 8 wherein the heavily doped source region and the heavily doped drain region are self-aligned a controlled distance of approximately 1500 Å lateral to the gate electrode.

11. A MOS transistor according to claim 8 wherein the nitride layer is deposited on the substantially straight vertical lateral sides of the gate electrode a controlled thickness in a range from 100 Å to 200 Å.

12. A MOS transistor according to claim 8 wherein the nitride layer is deposited on the substantially straight vertical lateral sides of the gate electrode a controlled thickness of approximately 150 Å.

13. A MOS transistor according to claim 8 wherein the semiconductor substrate surface includes an area overlaid by the gate electrode and the nitride layer formed on the substantially straight vertical lateral sides of the gate electrode and an area adjacent to the gate electrode and nitride layers that is exposed, the MOS transistor further comprising:
   a layer of titanium silicide reacted onto the exposed area of the semiconductor substrate surface and reacted onto the gate electrode, the nitride layer being unreactive to titanium.

14. A MOS transistor according to claim 8 wherein the gate electrode is a polysilicon gate electrode that is heavily doped with ions of the second conductivity type complementary to the first conductivity type, the heavily doped polysilicon gate electrode having a heavier doping dosage than the lightly doped regions of the semiconductor substrate.

* * * * *